United States Patent
Zhong et al.

(10) Patent No.: US 9,040,326 B2
(45) Date of Patent: May 26, 2015

(54) HIGH LIGHT EXTRACTION EFFICIENCY NITRIDE BASED LIGHT EMITTING DIODE BY SURFACE ROUGHENING

(71) Applicant: The Regents of the University of California, Oakland, CA (US)

(72) Inventors: Hong Zhong, Temple City, CA (US); Anurag Tyagi, San Jose, CA (US); Kenneth J. Vampola, Santa Barbara, CA (US); James S. Speck, Goleta, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/456,768

(22) Filed: Aug. 11, 2014

(65) Prior Publication Data

US 2014/0346542 A1    Nov. 27, 2014

Related U.S. Application Data

(63) Continuation of application No. 13/349,342, filed on Jan. 12, 2012, now Pat. No. 8,835,200, which is a continuation of application No. 12/325,946, filed on Dec. 1, 2008, now Pat. No. 8,114,698.

(60) Provisional application No. 60/991,617, filed on Nov. 30, 2007.

(51) Int. Cl.
*H01L 33/02* (2010.01)
*H01L 33/22* (2010.01)
(Continued)

(52) U.S. Cl.
CPC .............. *H01L 33/22* (2013.01); *H01L 33/20* (2013.01); *H01L 33/32* (2013.01);
(Continued)

(58) Field of Classification Search
CPC ... H01L 33/32; H01L 33/22; H01L 21/02458; H01L 21/02433
USPC .............. 438/29, 52, 80, 96; 257/98, 103, 257/E33.025, 67, 74
See application file for complete search history.

(56) References Cited

U.S. PATENT DOCUMENTS

| | | | |
|---|---|---|---|
| 5,693,180 A | 12/1997 | Furukawa et al. |
| 5,981,392 A | 11/1999 | Oishi |
| 6,012,958 A | 1/2000 | Tjaden et al. |
| 7,408,201 B2 | 8/2008 | Keuper et al. |
| 7,427,772 B2 | 9/2008 | Chuo et al. |
| 7,517,728 B2 | 4/2009 | Leung et al. |

(Continued)

FOREIGN PATENT DOCUMENTS

| | | |
|---|---|---|
| CN | 1223462 | 7/1999 |
| CN | 1957447 | 5/2007 |

(Continued)

OTHER PUBLICATIONS

Japanese Office Action dated Apr. 30, 2013, Application No. 2010-536226, with English translation.

(Continued)

*Primary Examiner* — Michael Lebentritt
(74) *Attorney, Agent, or Firm* — Gates & Cooper LLP

(57) ABSTRACT

A III-nitride light emitting diode (LED) and method of fabricating the same, wherein at least one surface of a semipolar or nonpolar plane of a III-nitride layer of the LED is textured, thereby forming a textured surface in order to increase light extraction. The texturing may be performed by plasma assisted chemical etching, photolithography followed by etching, or nano-imprinting followed by etching.

20 Claims, 12 Drawing Sheets

(51) Int. Cl.
  *H01L 33/32* (2010.01)
  *H01L 21/02* (2006.01)
  *H01L 33/00* (2010.01)
  *H01L 33/10* (2010.01)
  *H01L 33/20* (2010.01)
  *H01L 33/18* (2010.01)

(52) U.S. Cl.
  CPC ... *H01L 21/02433* (2013.01); *H01L 21/02458* (2013.01); *H01L 33/0075* (2013.01); *H01L 33/10* (2013.01); *H01L 2933/0083* (2013.01); *H01L 33/18* (2013.01)

(56) References Cited

U.S. PATENT DOCUMENTS

| | | | |
|---|---|---|---|
| 7,674,699 | B2 | 3/2010 | Shibata |
| 7,723,216 | B2 | 5/2010 | Chakraborty et al. |
| 7,737,636 | B2 | 6/2010 | Li et al. |
| 7,858,995 | B2 | 12/2010 | Nakagawa et al. |
| 8,114,698 | B2 * | 2/2012 | Zhong et al. ............... 438/52 |
| 8,835,200 | B2 * | 9/2014 | Zhong et al. ............... 438/29 |
| 2001/0019880 | A1 | 9/2001 | Ebertseder et al. |
| 2003/0222263 | A1 | 12/2003 | Choi |
| 2006/0001046 | A1 | 1/2006 | Batres et al. |
| 2006/0189098 | A1 | 8/2006 | Edmond |
| 2007/0121690 | A1 | 5/2007 | Fujii et al. |
| 2007/0145397 | A1 | 6/2007 | DenBaars et al. |
| 2007/0158785 | A1 | 7/2007 | D'Evelyn et al. |
| 2007/0252164 | A1 | 11/2007 | Zhong et al. |
| 2008/0121918 | A1 | 5/2008 | DenBaars et al. |
| 2009/0095973 | A1 | 4/2009 | Tanaka et al. |
| 2009/0278145 | A1 | 11/2009 | Sakai |

FOREIGN PATENT DOCUMENTS

| | | |
|---|---|---|
| EP | 1748470 | 1/2007 |
| EP | 1965442 | 9/2008 |
| JP | 2004111514 | 4/2004 |
| JP | 2006-5331 | 1/2006 |
| JP | 2006-100684 | 4/2006 |
| JP | 2007088277 | 4/2007 |
| JP | 2007521641 | 8/2007 |
| JP | 2008-305971 | 12/2008 |
| TW | 529149 | 4/2003 |
| WO | 2005064666 | 7/2005 |
| WO | 2005112123 | 11/2005 |
| WO | 2007069651 | 6/2007 |

OTHER PUBLICATIONS

Japanese Office Action (with English translation) dated Oct. 31, 2013 for Japanese Patent Application No. 2010-536226.
Bernardini, F. et al., "Spontaneous versus piezoelectric polarization in III-V nitrides: conceptual aspects and practical consequences," Phys. Stat. Sol. (b) 216, 391, 1999, pp. 391-398.
Chen, C. et al., "A new selective area lateral epitaxy approach for depositing a-plane GaN over r-plane sapphire," Jpn. J. Appl. Phys., vol. 42, 2003, pp. L818-L820.
Chichibu, S. et al., "Spontaneous emission of localized excitons in InGaN single and multiquantum well structures," Appl. Phys. Lett. 69 (27), Dec. 30, 1996, pp. 4188-4190.
Fang, H. et al., "Studies of improving light extraction efficiency of high power blue light-emitting diode by photo-enhanced chemical etching," Journal of Crystal Growth 298, 2007, pp. 703-705.
Fujii , T. et al., "Increase in the extraction efficiency of GaN-based light-emitting diodes via surface roughening," Applied Physics Letters, vol. 84, No. 6, Feb. 9, 2004, pp. 855-857.
Fujita, A. et al., "Active magnetic regeneration behavior of spherical hydrogenated La(Fe0.86Si0.14)13 fabricated by rotating electrode process," Japanese Journal of Applied Physics, vol. 46, No. 8, 2007, pp. L154-L156.
Kawakami, Y. et al., "Dimensionality of excitons in InGaN-based light emitting devices," Phys. Stat. Sol. (a) 178, 331, 2000, pp. 331-336.
Manyakhin, F. et al., "Aging mechanisms of InGaN/AlGaN/GaN light-emitting diodes operating at high currents," MRS Internet J. Nitride Semicond. Res. 3, 53, 1998, pp. 1-6.
Masui, H. et al., "Effects of phosphor application geometry on white light-emitting diodes," Japanese Journal of Applied Physics, vol. 45, No. 34, 2006, pp. L910-L912.
Masui, H. et al., "Light-polarization characteristics of electroluminescence from InGaN/GaN light-emitting diodes prepared on (1122)-plane GaN," Journal of Applied Physics 100, 2006, pp. 113109-1-113109-5.
Nishida, T. et al., "Efficient and high-power AlGaN-based ultraviolet light-emitting diode grown on bulk GaN," Applied Physics Letters, vol. 79, No. 6, Aug. 6, 2001, pp. 711-712.
Romanov, A. et al., "Strain-induced polarization in wurtzite III-nitride semipolar layers," Journal of Applied Physics 100, 2006, pp. 023522-1-023522-10.
Sato, H. et al., "High power and high efficiency green light emitting diode on free-standing semipolar (1122) bulk GaN substrate," Phys. Stat. Sol. (RRL) 1, No. 4, 2007, pp. 162-164.
Sharma, R. et al., "Demonstration of a semipolar (1013) InGaN/GaN green light emitting diode," Applied Physics Letters 87, 2005, pp. 231110-1-231110-3.
Tyagi, A. et al., "High brightness violet InGaN/GaN light emitting diodes on semipolar (1011) bulk GaN substrates," Japanese Journal of Applied Physics, vol. 46, No. 7, 2007, pp. L129-L131.
Walterreit, P. et al., "Nitride semiconductors free of electrostatic fields for efficient white light-emitting diodes," Nature, vol. 406, Aug. 24, 2000, pp. 865-868.
Zhong, H. et al., "Demonstration of high power blue-green light emitting diode on semipolar (1122) bulk GaN substrate," Electronics Letters, vol. 43, No. 15, Jul. 19, 2007, pp. 825-827.
Zhong, H. et al., "High power and high efficiency blue light emitting diode on freestanding semipolar (1011) bulk GaN substrate," Applied Physics Letters 90, 2007, pp. 233504-1-233504-3.
Chinese Office Action dated Jun. 4, 2012 for CN application No. 200880117788.7.
Chinese Office Action (with English Translation) dated Nov. 5, 2012 for Chinese Patent Application No. 200880117788.7.
International Search Report mailed Feb. 4, 2009, International application No. PCT/US2008/085191, International filed Dec. 1, 2008.
Japanese Office Action (with English translation) dated Nov. 15, 2011 for Japanese Patent Application No. 2008-554403.
Chinese Office Action dated Jun. 8, 2011 for Chinese Application No. 200880117788.7.
Miller, P., "Seoul Semiconductor squeezes 240 lumens into "brightest" LED", http://www.engadget.com/2006/12/12/seoul-semiconductor-squeezes-240-lumens-into-brightest-led.
Chen, C., et al., "Ultraviolet Light-Emitting Diodes Using Non-Polar a-Plane GaN-AlGaN Multiple Quantum Wells", Japanese Journal of Applied Physics, 2003, pp. L1039-L1040, vol. 42.
Masui, H., et al., "First-Moment Analysis of Polarized Light Emission from InGaN/GaN Light-Emitting Diodes Prepared on Semipolar Planes", Japanese Journal of Applied Physics, 2006, pp. L904-L906, vol. 45, No. 34.
Schubert, E.F., "Light-Emitting Diodes, 2nd Edition", Cambridge, pp. 93, Jun. 19, 2006.
Japanese Office Action and Japanese Denial of Entry of Amendment (with English translations) dated Sep. 9, 2014 for Japanese Patent Application No. 2010-536226.
Chinese Office Action (with English translation) dated Aug. 9, 2013 for Chinese Patent Application No. 200880117788.7.
Taiwanese Office Action (with English translation) dated Sep. 16, 2013 for Taiwanese Patent Application No. 097146655.
Korean Office Action (with English translation) dated Oct. 31, 2014 for Korean Patent Application No. 10-2010-7013951.
European Extended Search Report dated Nov. 21, 2014 for European Patent Application No. 08854859.9.
Oder, T.N., "Nitride microlens arrays for blue and ultraviolet wavelength applications", Applied Physics Letters, May 26, 2003, pp. 3692-3694, vol. 82, No. 21.

* cited by examiner

HIGH LIGHT EXTRACTION EFFICIENCY NITRIDE BASED LIGHT EMITTING DIODE BY SURFACE ROUGHENING

CROSS REFERENCE TO RELATED APPLICATIONS

This application is a continuation of co-pending and commonly-assigned:

U.S. Utility patent application Ser. No. 13/349,342, filed on Jan. 12, 2012, by Hong Zhong, Anurag Tyagi, Kenneth J. Vampola, James S. Speck, Steven P. DenBaars, and Shuji Nakamura, entitled "HIGH LIGHT EXTRACTION EFFICIENCY NITRIDE BASED LIGHT EMITTING DIODE BY SURFACE ROUGHENING,", which application is a continuation of co-pending and commonly-assigned:

U.S. Utility patent application Ser. No. 12/325,946, filed on Dec. 1, 2008, by Hong Zhong, Anurag Tyagi, Kenneth J. Vampola, James S. Speck, Steven P. DenBaars, and Shuji Nakamura, entitled "HIGH LIGHT EXTRACTION EFFICIENCY NITRIDE BASED LIGHT EMITTING DIODE BY SURFACE ROUGHENING,", now U.S. Pat. No. 8,114,698, issued Feb. 14, 2012, which application claims the benefit under 35 U.S.C. Section 119(e) of co-pending and commonly-assigned:

U.S. Provisional Patent Application Ser. No. 60/991,617, filed on Nov. 30, 2007, by Hong Zhong, Anurag Tyagi, Kenneth J. Vampola, James S. Speck, Steven P. DenBaars, and Shuji Nakamura, entitled "HIGH LIGHT EXTRACTION EFFICIENCY NITRIDE BASED LIGHT EMITTING DIODE BY SURFACE ROUGHENING,", all of which applications are incorporated by reference herein.

BACKGROUND OF THE INVENTION

1. Field of the Invention

This invention relates to light emitting diodes (LEDs) and more particularly to high light extraction efficiency gallium nitride based LEDs via surface roughening.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Gallium nitride (GaN) based wide band gap semiconductor LEDs have been available for almost 15 years. The progress of LED development has brought about great changes in LED technology, with the realization of full-color LED displays, LED traffic signals, white LEDs, and so on.

High efficiency white LEDs have gained much interest as possible replacements for fluorescent lamps - the luminous efficacy of white LEDs (130-150 lumens/watt [1]) already surpasses that of ordinary fluorescent lamps (75 lumens/watt). Nevertheless, current commercially available wurzite nitride based LEDs are characterized by the presence of polarization-related electric fields inside multi-quantum wells (MQWs), for their [0001] c-polar growth orientation. The discontinuities in both spontaneous and piezoelectric polarization at the heterointerfaces result in internal electric fields in quantum wells which cause carrier separation (quantum confined Stark effect (QCSE)) and reduce the radiative recombination rate within quantum wells [2-5].

To decrease these polarization-related effects, growing III-nitride devices on the nonpolar planes, viz, the (1-100) m-plane or the (11-20) a-plane, has been demonstrated [6-7]. Another approach to reduce, and possibly eliminate those effects, is to grow III-nitride devices on crystal planes that are inclined with respect to the c-direction, i.e., semipolar planes. Devices grown on different semipolar planes, including (10-1-1), (10-1-3), (11-22) and others, have also been demonstrated [8-10]. These planes have reduced polarization discontinuity in heterostructures compared with the c-plane III-nitride materials; and for semipolar planes oriented ~45 degree from the c-plane, there is no polarization discontinuity in InGaN/GaN heterostructures [5]. Recently, with the advent of high quality freestanding GaN substrates, high performance nonpolar and semipolar LEDs with peak emission wavelengths ranging from 407 nm to 513 nm on nonpolar m-plane, semipolar (10-1-1), and (11-22) freestanding GaN substrates have been reported. The performance highlights of those LEDs are summarized in Table 1 [11-15]. Those devices show greatly reduced polarization-related electric fields in the quantum wells, which enables one to employ thicker quantum wells inside an LED, which is believed to be crucial for devices operating under high currents. Therefore, LEDs grown on nonpolar and semipolar oriented GaN substrates hold great promise for commercially useful solid-state lighting applications and could be commercially viable as high quality freestanding GaN substrates become more available.

TABLE 1

Summary of the performance of recently reported semipolar and nonpolar LEDs.

| Peak Emission Wavelength | Crystal Orientation | Output Power at 20 mA drive current | External Quantum Efficiency at 20 mA drive current |
|---|---|---|---|
| 407 nm (violet-blue), | Nonpolar m-plane, | 23.7 mW, | 38.9%, |
| 411 nm (violet-blue) | Semipolar (10-1-1) plane | 20.58 mW | 33.9% |
| 444 nm (blue) | Semipolar (10-1-1) plane | 16.21 mW (under pulsed operations, 10% duty cycle) | 29% (under pulsed operations, 10% duty cycle) |
| 489 nm (blue-green) | Semipolar (11-22) plane | 9 mW (under pulsed operations, 10% duty cycle) | 18% (under pulsed operations, 10% duty cycle) |
| 516 nm (green) | Semipolar (11-22) plane | 5 mW | 10.5% |

Current techniques to improve the efficiency of an LED fall under two distinct categories: increasing the internal quantum efficiency or the extraction efficiency.

Increasing the internal quantum efficiency, determined by crystal quality and epitaxial layer structure, could be rather difficult. A typical internal quantum efficiency value for blue LEDs is more than 70% [16] and an ultraviolet (UV) LED grown on a low-dislocation GaN substrate has recently exhibited an internal quantum efficiency as high as 80% [17]. There might be little room for improvement over these values, especially for nonpolar and semipolar oriented devices grown on high quality freestanding GaN substrates.

On the other hand, there is plenty of room for improving the light extraction efficiency. For a bare chip nitride based LED, because of the rather huge difference between the refractive indices of GaN (n=2.5) and air (n=1), the angle of the light escape cone is only 23 degrees, which leads to a meager light extraction efficiency that is as low as 4.18% [18]. The light outside the escape cone is reflected repeatedly inside the device and eventually absorbed by the active region or the electrodes.

Surface roughening procedures could be used to significantly reduce internal loss of light and encourage light escape from the device. FIG. 1 is a schematic cross-sectional illustration of a surface roughened LED, comprising an n-type electrode 10, n-type III-nitride layer 11, III-nitride active region 12, p-type III-nitride layer 13 and p-type electrode 14 that is bonded to a silicon sub-mount 16 via a gold tin bonding 15. A photo-enhanced chemical (PEC) etching is used to roughen the backside 17 of the n-type layer 11, which is a nitrogen-face (N-face) GaN surface. The arrow 18 indicates a possible trajectory for light emitted by the LED. A 130% increase in output power was measured for a surface roughened LED compared with a smooth surface and otherwise identical device [19].

Although surface roughening by PEC etching is a sine qua non for improving light extraction from a nitride based LED, the effectiveness of this technique by and large hinges on the crystal orientation and polarity of the to-be-roughened surface, particularly, the nitrogen face of a c-polar [0001] GaN [21]. As a result, PEC etching could not be applied to surfaces of other GaN crystal orientations and polarity, including a-face (11-20), nonpolar m-face (1-100), and most of the semipolar surfaces. The lack of means for surface roughening has become a major hurdle for nonpolar and semipolar LEDs to achieve higher extraction efficiency and hence higher overall efficiency, and therefore improved roughening techniques are needed to address this issue.

SUMMARY OF THE INVENTION

The present invention describes a method of increasing the light extraction efficiency from a nitride based LED, which involves photolithography and plasma-assisted chemical dry etching. Through increasing light extraction, subsequent improvement of efficiency is thus expected. One most noticeable advantage of the present invention is that it significantly increases the light extraction efficiency from a nitride-based LED, including films that are grown along nonpolar and semipolar orientations. In addition, this invention is more straightforward compared to other light extraction enhancement techniques, such as using a photonic crystal. More important, unlike photo-enhanced chemical etching that is also a simple light extraction enhancement technique, the present invention is more versatile as it could be applied to any nitride semiconductor surface regardless of its crystal structure.

Therefore, to overcome the limitations in the prior art described above, and to overcome other limitations that will become apparent upon reading and understanding the present specification, the present invention describes a method for fabricating a III-nitride LED, comprising texturing at least one surface of a semipolar or nonpolar plane of a III-nitride layer of the LED to form a textured surface, wherein the texturing step is performed by plasma assisted chemical etching. The texturing step may be performed by photolithography followed by the etching, or the textured surface may be formed using nano-imprinting followed by the etching. Light emitted by an active region of the LED is mostly extracted from the textured surface.

The texturing step may further comprise: (1) creating at least one feature with at least one sidewall that reflects and transmits at least one light ray incident from inside the feature; and inclining the sidewall such that each time the ray is reflected, an angle of incidence of the ray relative to a surface normal of the sidewall decreases, such that when the angle of incidence of the ray is smaller than a critical angle, the ray's transmission through the sidewall is increased, and when the angle of incidence of the ray is at least equal to the critical angle, the ray is reflected by the sidewall.

The present invention further discloses a method for emitting light from a III-nitride LED, comprising emitting the light from at least one textured surface of a semipolar or nonpolar plane of a III-nitride layer of the LED, wherein the texturing is performed by plasma assisted chemical etching.

The present invention further discloses a III-nitride LED, comprising n-type III-nitride; p-type III-nitride; a III-nitride active layer, that emits light, formed between the n-type III-nitride and p-type III-nitride; a III-nitride light extraction surface on the n-type III-nitride and forming an interface with an external medium, wherein the III-nitride light extraction surface has features with at least one sloped sidewall which transmits the light into external medium air at the interface and reflects the light at the interface, wherein: (1) the reflected light, after undergoing subsequent reflections inside the features, has an increased incidence angle relative to the interface and consequently an increased chance of being transmitted to the external medium, and (2) the n-type III-nitride, p-type III-nitride, and III-nitride active layer are semi-polar or non-polar layers. The external medium may be a medium with a smaller refractive index than III-nitride, for example air or a vacuum.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

The present invention describes a technique for increasing the light extraction efficiency from a nitride based LED, which involves photolithography and plasma-assisted chemical dry etching. Through increasing light extraction, subsequent improvement of efficiency is thus expected.

In one embodiment of the present invention, the freestanding GaN substrate surface of the opposite side of the LED growth front is roughened. After the device is fabricated, the LED is then placed within a shaped optical element.

Figure 1:
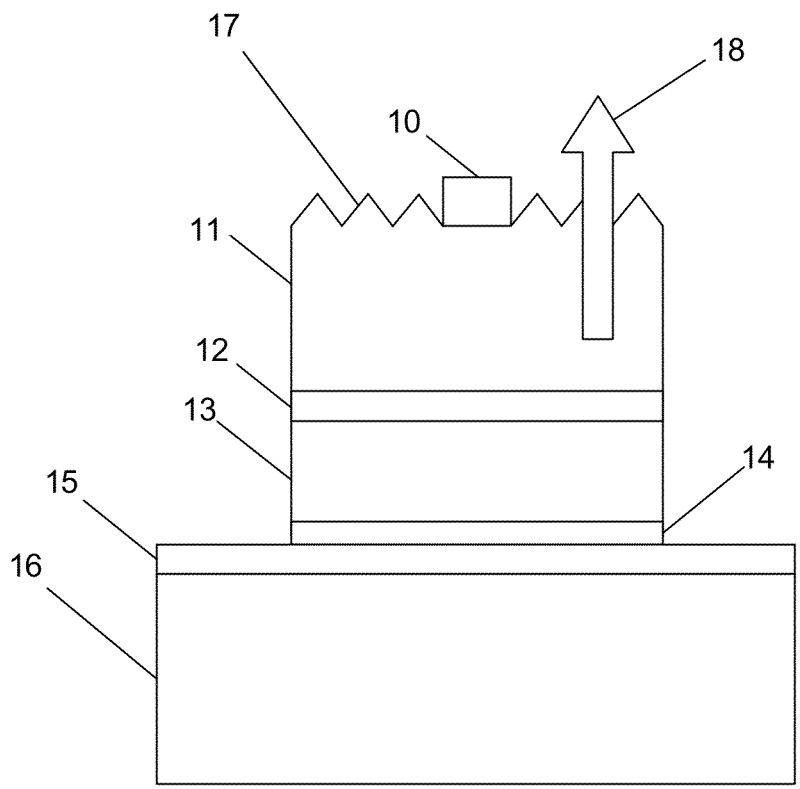
FIG. 1 is a schematic cross-section of an (Al, Ga, In)N LED with backside roughened by photo-enhanced chemical etching.
Figure 2:
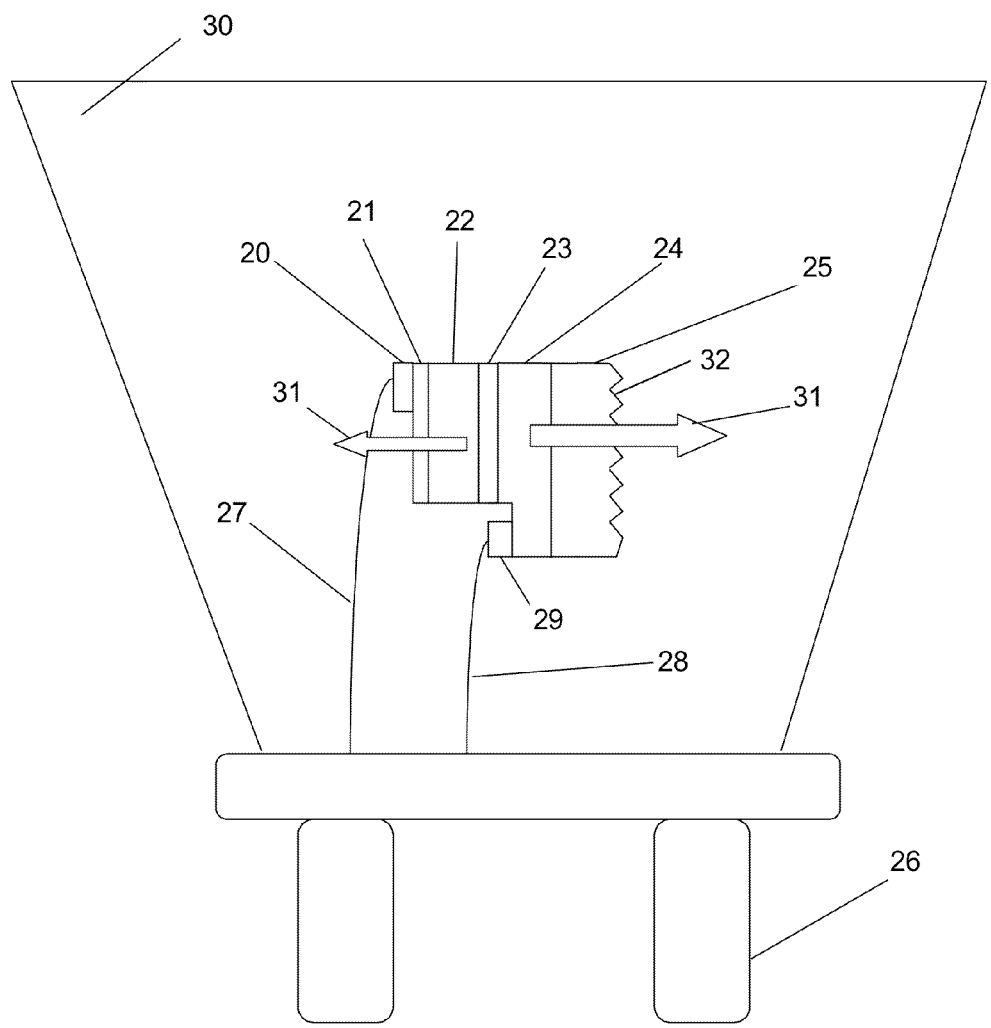
FIG. 2 is a schematic cross-section of an (Al, Ga, In)N LED in a suspended geometry with backside roughened by the current invention.

FIG. 2 shows a schematic representation of a surface roughened LED packaged in a suspended geometry according to the preferred embodiment of the present invention. The LED is comprised of a p-type metal electrode 20, semi-transparent p-type electrode 21, p-type III-nitride layer 22, III-nitride active region 23, n-type III-nitride layer 24, double-side-polished freestanding GaN substrate 25 on which surface roughening is performed by plasma-assisted chemical etching, metal header 26, metal wire 27 (connecting to the p-electrode 20), metal wire 28 (connecting to the n-type metal electrode 29), and a silicone cone mold 30 into which the LED chip encapsulates. The arrows 31 indicate possible trajectories for light emitted by the LED.

Plasma-assisted chemical etching is performed on the backside surface 32 of the GaN substrate 25 after etching masks are defined. With a certain proportion of different corrosive gases, including, but not limited to, chlorine and fluorine based gases, and other gases, under certain chamber pressure and plasma powers, plasma-assisted chemical etching defines the unmasked area with features that are characterized by sloped sidewalls. As a result, the surface 32 is roughened through the formation of conical features that tile up most of the surface 32. Concavity that resembles a meteorite crater might be formed on top of each conical feature as a result of a combination of appropriate etching conditions, etching time, and the use of material of the etching masks. Etching conditions of an exemplary roughening procedure, performed by an inductively coupled plasma (ICP) etcher, include a certain ratio of chlorine-based and fluorine-based gases (10:1 to 150:1), appropriate ICP power, ranging from 100 Watt to 1000 Watt, desirable bias power, ranging from 10 Watt to 500 Watt, and suitable chamber pressure (1-50 Pascal).

Figure 3A:
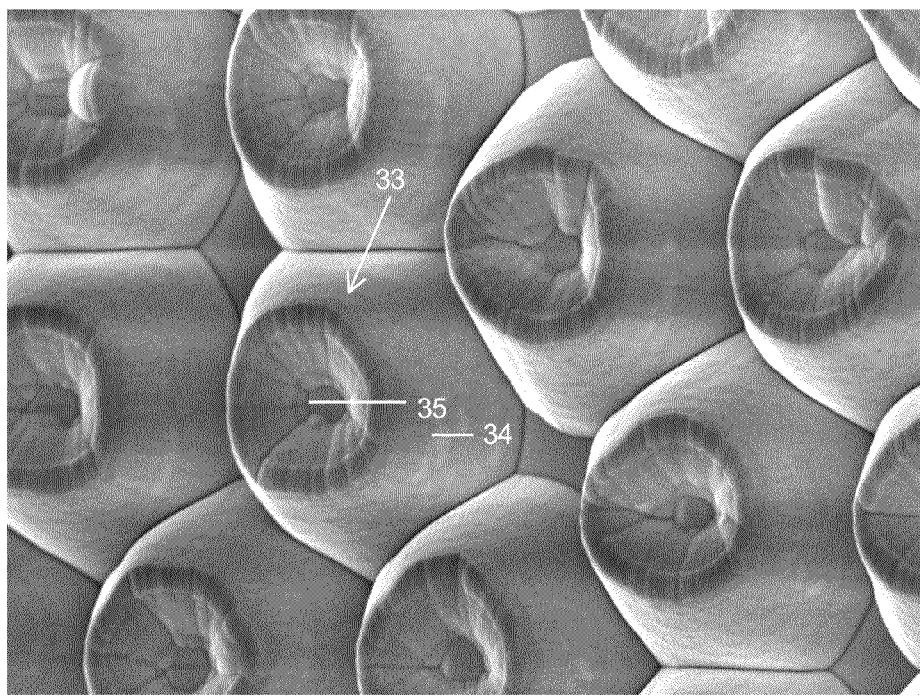
FIG. 3a is a scanning electron microscopy (SEM) image of a GaN surface after roughening.
Figure 3B:
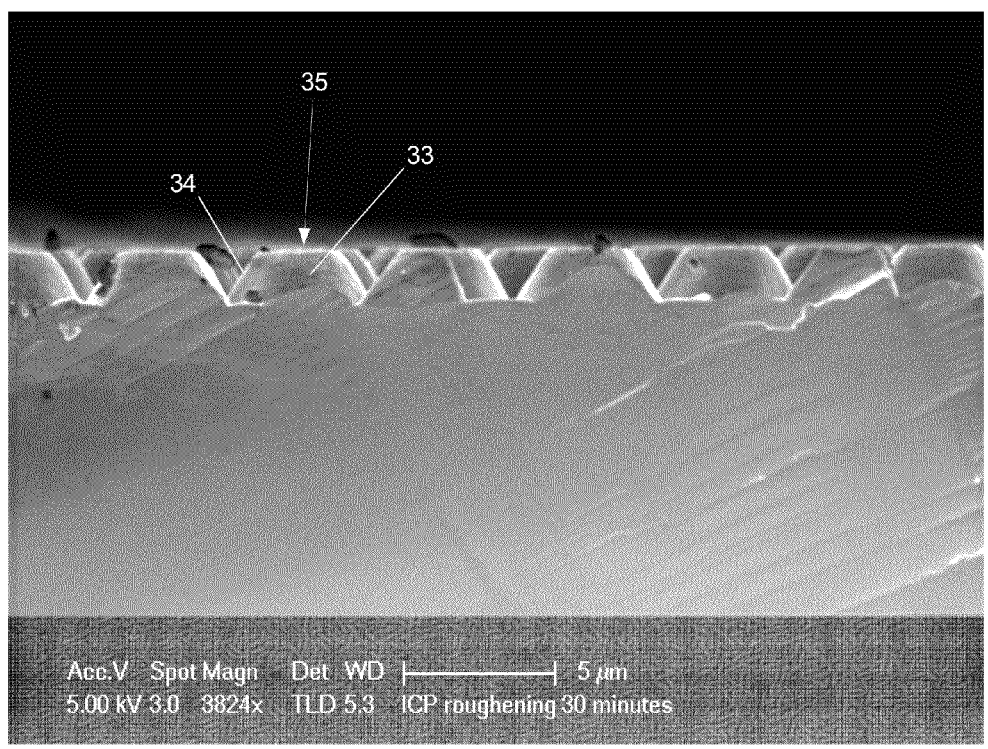
FIG. 3b is a cross-sectional SEM image of a GaN surface after roughening.

FIG. 3a is an SEM image of a GaN surface after a 30 minute treatment of the exemplary roughening procedure with the use of circular etching masks (2 micron in diameter and 8 micron apart from center to center), and FIG. 3b is a cross-sectional SEM image of the same sample. FIGS. 3a and 3b illustrate how the surface is roughened through the formation of conical features 33 (with sloped sidewalls 34) that tile up most of the surface, and how a concavity 35 might be formed on top of each conical feature 33.

Figure 4:
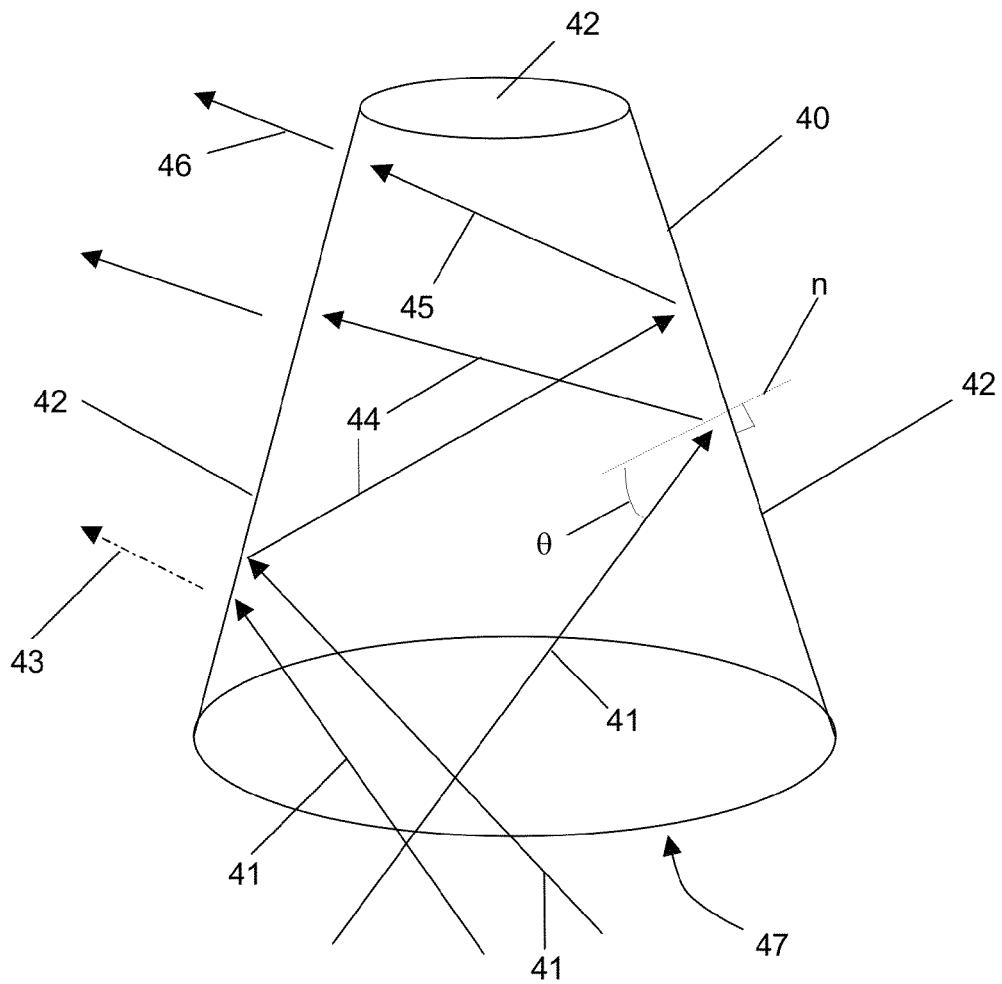
FIG. 4 illustrates the process of light escaping from a conical feature.

Conical features (or truncated conical features) are believed to be beneficial to light extraction [20]. FIG. 4 illustrates the process of light escaping from such a conical feature 40, 33. Light rays 41 incident at the feature-air boundary 42 are either transmitted through the nitride semiconductor-air interface (or feature-air boundary 42) (dashed arrows 43), or reflected by the boundary 42 (solid arrows 44). Most of the reflected rays 44, after undergoing subsequent reflections 45 inside the feature 40 that leads to an increase of incidence angle (90°-θ) at the semiconductor-air interface (or feature-air interface 42), can eventually escape 46 from the cone 40 by a near normal incidence at the feature-air interface 42. In the above, the feature-air boundary 42 and semiconductor-air interface are equivalent. Light rays 41 originate from the active region, for example, and the feature 40 typically has an interface 47 with an n-type layer of the nitride.

Figure 5:
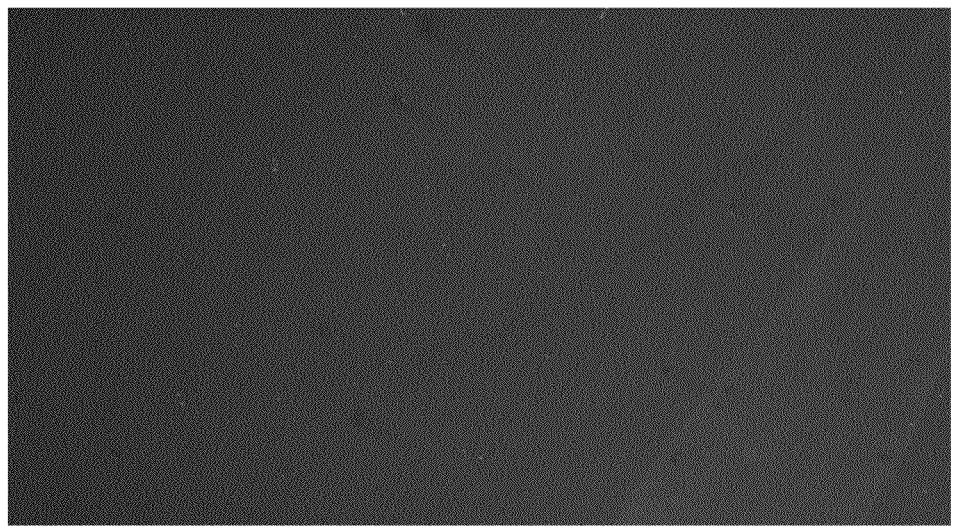
FIG. 5 is an optical microscopy image of a GaN surface after roughening.

FIG. 5 is an optical microscopy image of a roughened surface. The discolored and dark surface, resulting from the roughening procedure, can be ascribed to the light scattering at the boundary of air and GaN, and such surface in general has better light extraction characteristics than a smooth and "mirror-like" counterpart [19].

Figure 6:
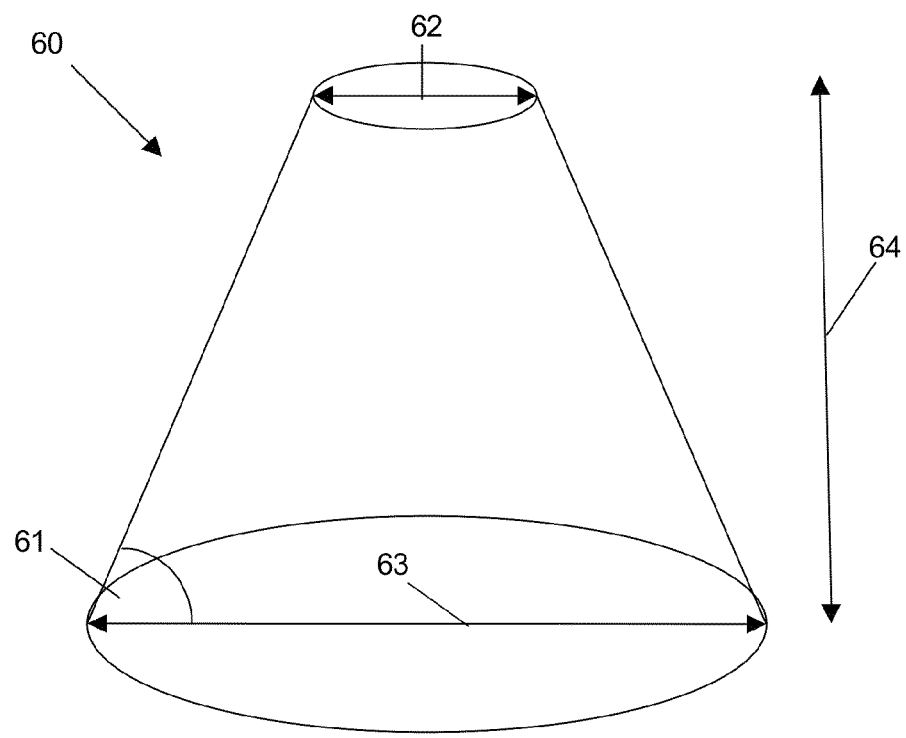
FIG. 6 illustrates the geometries of a conical feature.

Geometries of the roughened features 60, as shown in FIG. 6, including the sidewall inclination angle 61, cone diameters 62 and 63, and the height of the cone 64, as well as the number density of those conical features 60, could be tailored for optimal light extraction with the use of appropriate etching masks and suitable etching conditions. It should be noted that plasma assisted chemical etching is a non-equilibrium process, therefore this roughening procedure can be applied on any nitride semiconductor surfaces, regardless of their crystal orientations and polarity.

With such a design, light generated within the active region is able to escape effectively from both sides of the die; and the extraction efficiency of the light propagating toward the substrate can be considerably increased because of the surface roughening. As a result, an improvement over the output power is expected.

Processing Steps

Figure 7:
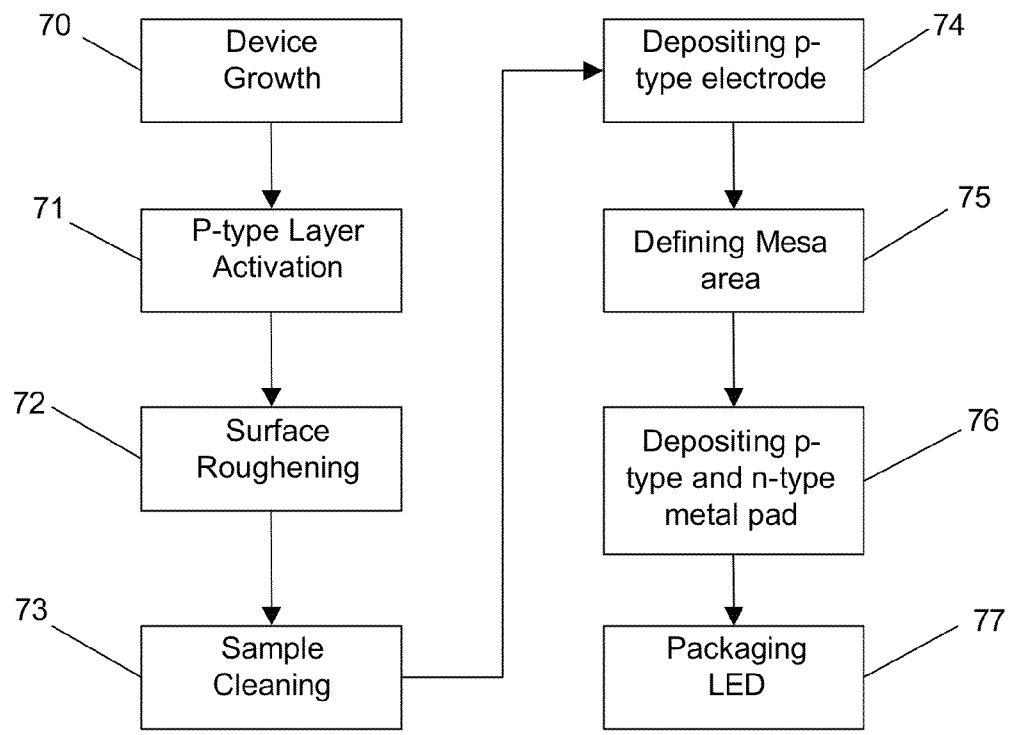
FIG. 7 is a flowchart, illustrating a method for fabricating a high light extraction efficiency LED structure.

FIG. 7 illustrates the processing steps for one embodiment of the invention.

Block 70 represents the step of growing epitaxial layers (device growth), for example on a double-side-polished freestanding GaN substrate by Metal-Organic Chemical Vapour Deposition (MOCVD), thereby creating the sample.

Block 71 represents the step of annealing the sample for activation of the p-type dopants (p-type activation).

Block 72 represents the step of surface roughening through plasma-assisted chemical etching.

Block 73 represents the step of cleaning the roughened sample using solvents and acids (sample cleaning)

Block 74 represents the step of depositing a p-type electrode (on the p-type layer), for example, a nickel and indium tin oxide (ITO) semi-transparent electrode.

Block 75 represents the step of defining the mesa areas by chlorine based dry etching, for example.

Block 76 represents the step of depositing p-type and n-type metal pads, for example deposition of the titanium, aluminum, nickel and gold n-type electrode and p-type electrodes.

Block 77 represents the step of packaging the LED, for example in a suspended geometry.

Possible Modifications and Variations

The LED may be comprised of polar c-face (0001) (Al, Ga, In)N, non polar a-face (11-20) and m-face (1-100) (Al, Ga, In)N, or semipolar (Al, Ga, In)N, wherein semipolar refers to a wide variety of planes that posses two non-zero h, i, or k Miller indices, and a non-zero l Miller index, {hikl}.

Moreover, besides freestanding and bulk GaN substrates, the LED may be grown on a foreign substrate, for instance, a sapphire, silicon carbide, silicon, germanium, gallium arsenide, gallium phosphide, indium phosphide, or spinel wafer, and techniques, such as laser lift-off, can be employed to separate the substrate and the nitride semiconductor so that the roughening process can proceed.

Figure 8:
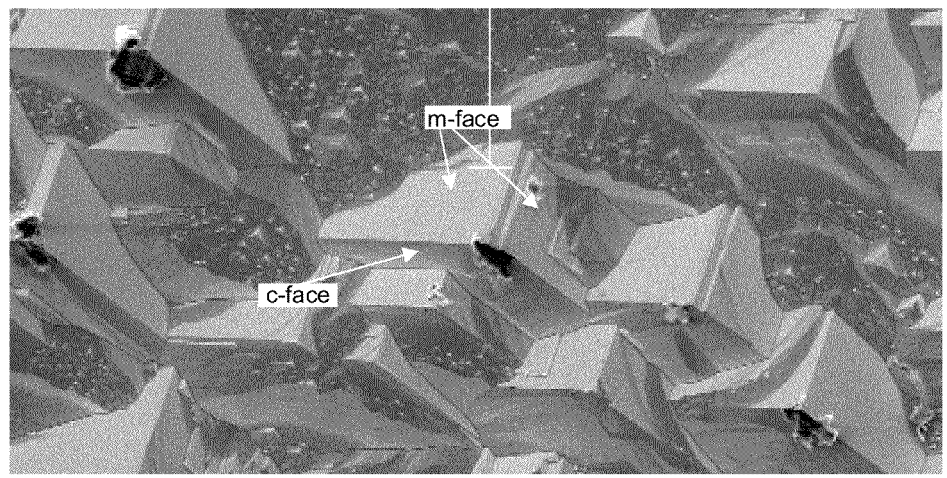
FIG. 8 is an SEM image of a semipolar (11-22) GaN surface after roughening by photo-enhanced chemical etching.

If the crystal orientation of the to-be-roughened surface is a semipolar (11-22) oriented GaN surface, surface roughening could be also performed by the photo-enhanced chemical (PEC) etching procedure. The roughened surface is covered by one or more triangular pyramids that are comprised of a c-polar (0001) GaN surface and m-face [1-100] GaN surfaces, as shown in FIG. 8.

This roughening technique could be applied to various high light extraction efficiency LED structures, other than the one covered in the preferred embodiment.

Figure 9:
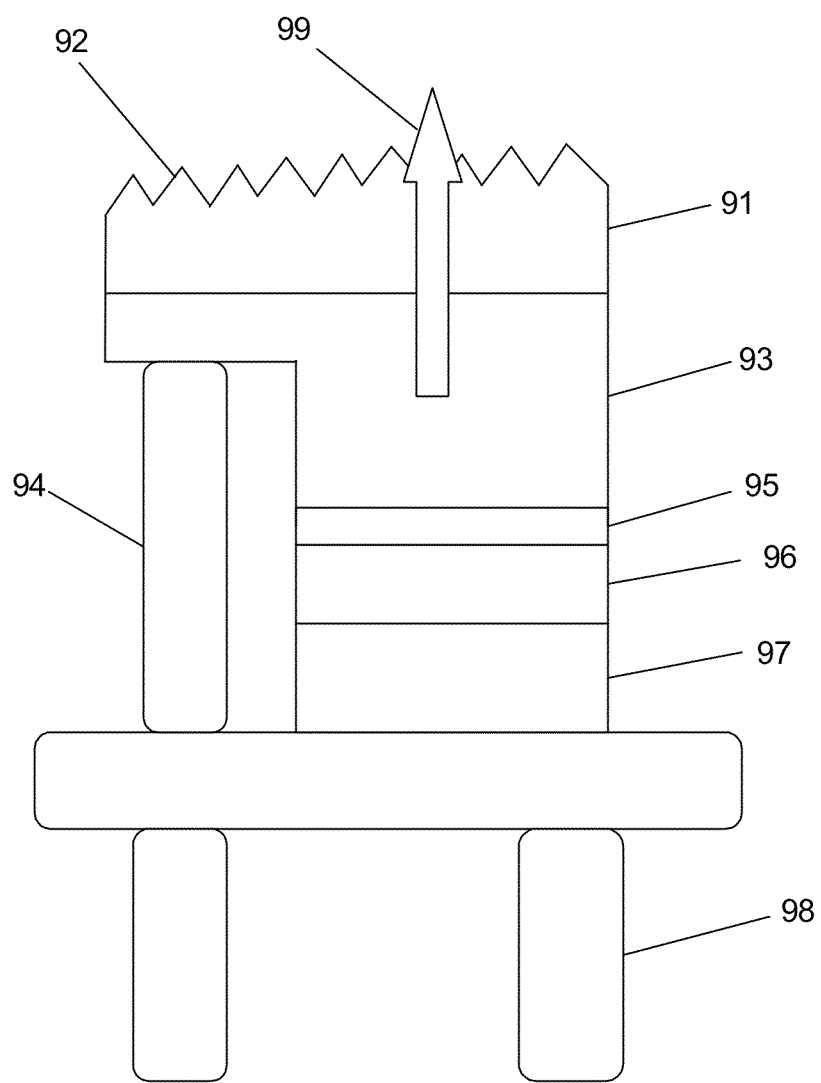
FIG. 9 is a schematic cross-section of an (Al, Ga, In)N LED in a flip-chip design with backside roughened by the current invention.

FIG. 9 is a schematic representation of a high light extraction efficiency LED according to an exemplary embodiment of the present invention. The LED, in a flip-chip structure, comprises a freestanding GaN substrate 91 roughened 92 by the invention, n-type III-nitride 93, n-type electrode 94, III-nitride active region 95, p-type III-nitride layer 96, p-type electrode and light reflector 97, and host sub-mount 98. The arrow 99 indicates a possible trajectory for light emitted by the LED.

Figure 10:
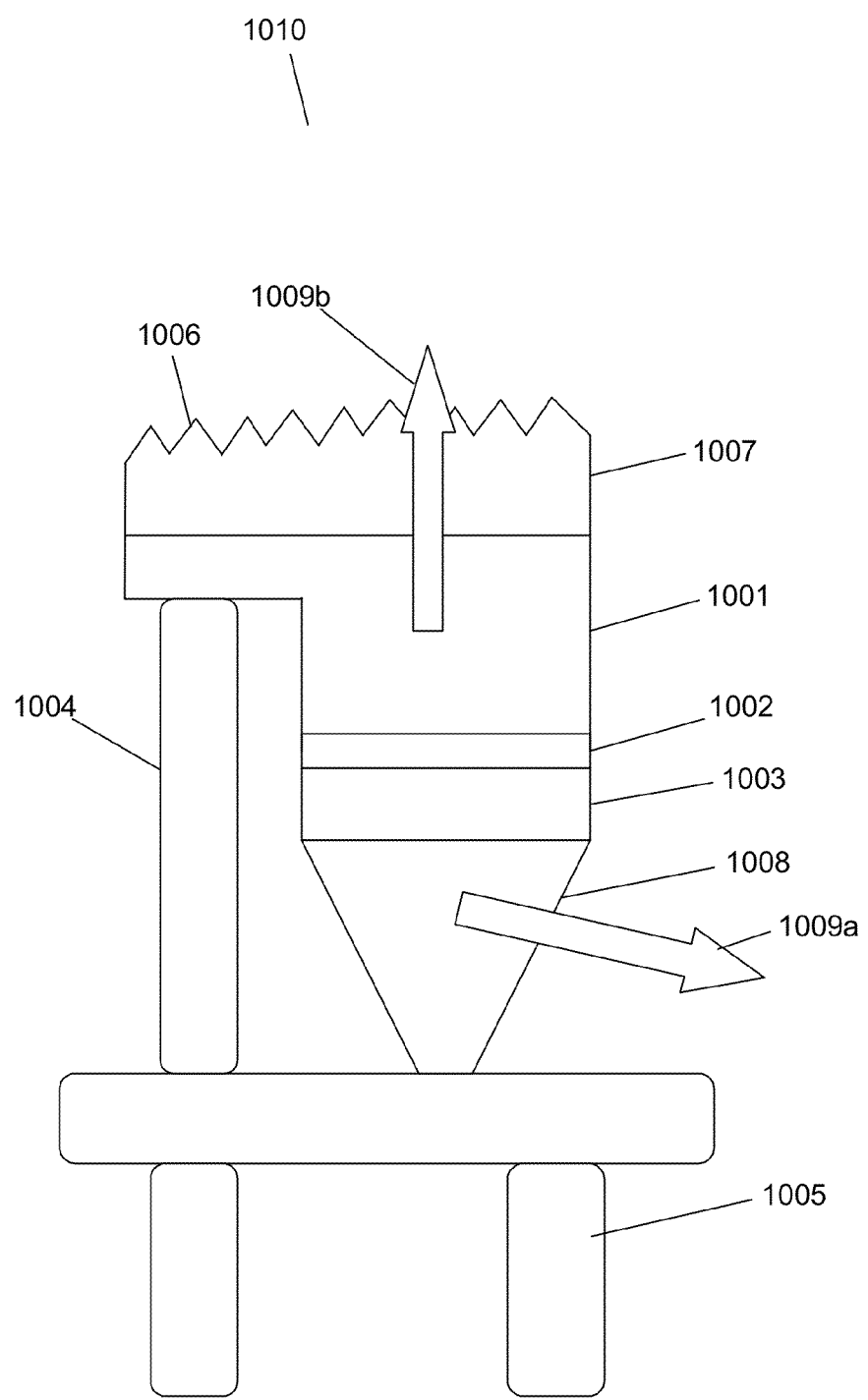
FIG. 10 is a schematic cross-section of an (Al, Ga, In)N LED in a flip-chip design with backside roughened by the current invention, and p-type III-nitride layer bonded with shaped zinc oxide or a transparent conductor.

FIG. 10 is a schematic representation of a high light extraction efficiency LED, according to an exemplary embodiment of the present invention. The LED comprises an n-type III-nitride layer 1001, III-nitride active region 1002, p-type III-nitride layer 1003, n-type electrode 1004, and a host sub-mount 1005. The backside 1006 of the freestanding GaN substrate 1007 is roughened by the present invention. Adjacent the p-type III-nitride layer 1003 is an n-type zinc oxide (ZnO) cone-shaped element 1008 with a p-type electrode, which can help improve light extraction of light 1009a emitted by the active layer 1002 toward the p-type layer 1003. The arrows 1009a, 1009b indicate possible trajectories for light emitted from the active region 1002 of the LED. The external medium 1010 is also shown.

Figure 11:
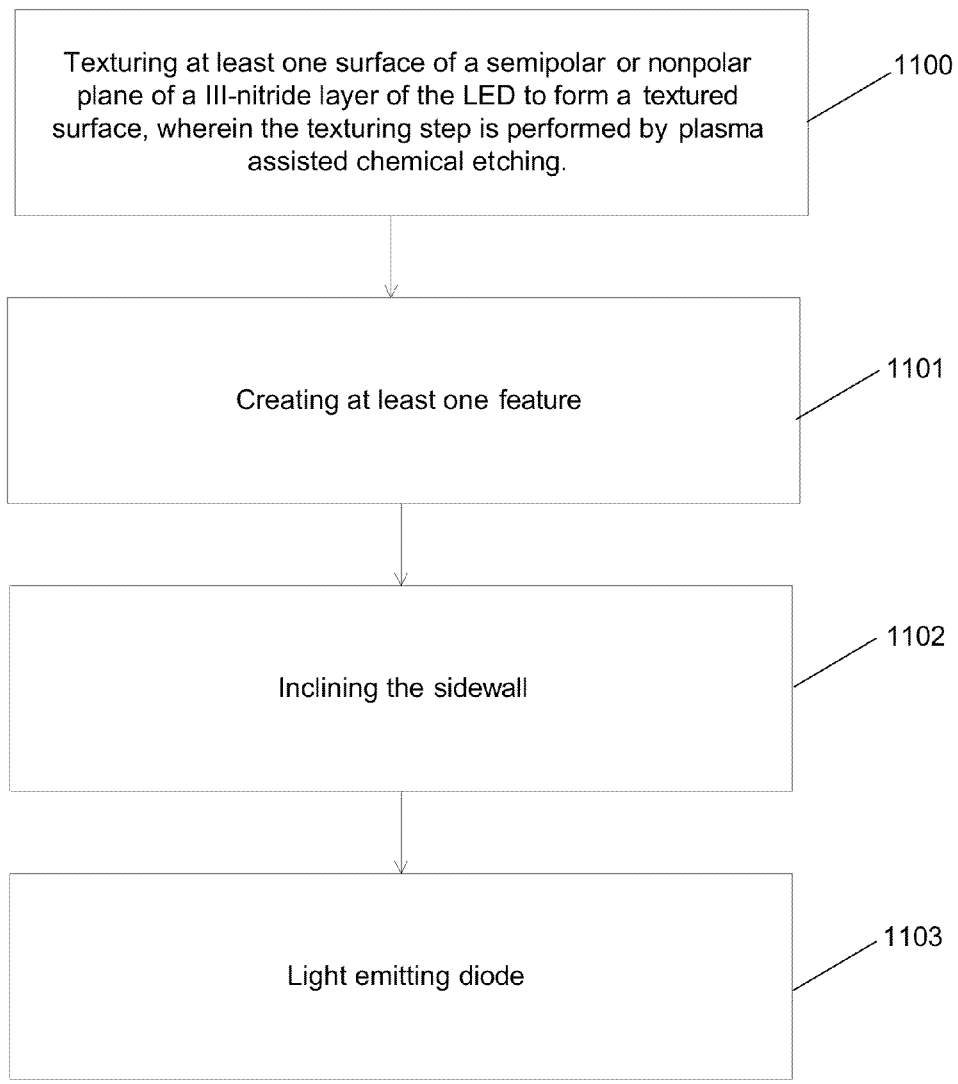
FIG. 11 is a flowchart illustrating a method of the present invention.

FIG. 11 is a flowchart illustrating a method for fabricating a III-nitride light emitting diode (LED).

Block 1100 represents the step of texturing at least one surface of a semipolar or nonpolar plane of a III-nitride layer of the LED to form a textured surface 1006, wherein the texturing step is performed by plasma assisted chemical etching. The texturing step may be performed by photolithography followed by the etching. The textured surface 1006 may be formed using nano-imprinting followed by the etching. Light emitted by an active region of the LED may be mostly extracted from the textured surface 1006. The texturing step of Block 1100 may further comprise (referring also to FIG. 4):

(1) Block 1101, representing the step of creating at least one feature 40 with at least one sidewall 42 that reflects 44 and transmits 43, 46 at least one light ray 41 incident from inside the feature 40, and (2) Block 1102, representing the step of inclining the sidewall 42 such that each time the ray is reflected 44, an angle of incidence $\theta$ of the ray 44 to a surface normal n of the sidewall 42 decreases, such that (a) when the angle of incidence $\theta$ of the ray is smaller than the critical angle ($\theta_c$), the ray's transmission 46 through the sidewall 42 is increased, and (b) when the angle of incidence $\theta$ of the ray 41, 44 is at least equal to the $\theta_c$, the ray is at least partially reflected 44 by the sidewall 42. $\theta_c$ is the critical angle above which total internal reflection occurs, $\theta_c$=acr $\sin(n_{external}/n_{internal})$, wherein $n_{ext}$ is the refractive index of the external medium 1015 and $n_{internal}$ is the refractive index of the internal medium, i.e. the feature 40. The surface normal n is an imaginary line perpendicular to the sidewall 42.

Block 1103 (referring also to FIG. 4 and FIG. 10) represents a device fabricated using the method of FIG. 11. The device may be a III-nitride light emitting diode (LED), comprising n-type III-nitride 1001; p-type III-nitride 1003; a III-nitride active layer 1002 for emitting light (1009a, 1009b), formed between the n-type III-nitride 1001 and p-type III-nitride 1003; a III-nitride light extraction surface 1006 on the substrate 1007 or on the n-type III-nitride 1001 and forming an interface with an external medium 1010, wherein the III-nitride light extraction surface 1006 has features 40 with at least one sloped sidewall 42 which transmits the light 1009b into the external medium 1010 at the interface and reflects the light at the interface, wherein: (1) the reflected light 44, after undergoing subsequent reflections 45 inside the features 40, has an increased incidence angle (90°-$\theta$) at the interface 42 and consequently an increased chance of being transmitted 1009b to the external medium 1010, and (2) the n-type III-nitride 1001, p-type III-nitride 1003, and III-nitride active layer 1002 are semi-polar or non-polar layers. The external medium 1010 is typically a medium with a smaller refractive index than III-nitride, for example air or a vacuum.

In the above description, III-nitrides may be referred to as Group III nitrides, or just nitrides, or by (Al, Ga,In, B)N, or by $Al_{(1-x-y)}In_yGa_xN$ where $0<x<1$ and $0<y<1$.

Advantages and Improvements

One most noticeable advantage of the present invention is that it significantly increases the light extraction efficiency from a nitride-based LED, including LEDs that are grown along nonpolar and semipolar orientations. In addition, this invention is more straightforward compared to other light extraction enhancement techniques, such as using a photonic crystal. More importantly, unlike PEC etching, which is also a simple light extraction enhancement technique, this invention is more versatile as it could be applied to any nitride semiconductor surface(s) regardless of their crystal structures. The present invention will enable high power and high efficiency LEDs.

References

The following references are incorporated by reference herein.

1. http://www.engadget.com/2006/12/12/seoul-semiconductor-squeezes-240-lumens-into-brightest-led
2. Appl. Phys. Lett., 69(27), pp. 4188-2190 (1996).
3. MRS Internet J. Nitride Semicond., Res. 3, (15) (1998).
4. Phys. Status Solidi B, 216(1), pp. 391-398 (1999).
5. J. Appl. Phys., 100, pp. 023522-023522-10 (2006).
6. Nature, 406, pp. 865-868 (2000).
7. Jpn. J. Appl. Phys. 42, pp. L1039-1040 (2003).
8. Appl. Phys. Lett., 87, pp. 231110-231110-3 (2005).
9. Jpn. J. Appl. Phys., 45, pp. L904-L906 (2006).
10. J. Appl. Phys., 100, pp. 113109-113109-5 (2006).
11. Jpn. J. Appl. Phys., 46, pp. L154-L157 (2007).
12. Jpn. J. Appl. Phys., 46, pp. L129-L131 (2007).
13. Appl. Phys. Lett., 90, pp. 233504-233504-3 (2007).
14. Electronics Lett., 43. No. 15 (2007).

15. Phy. Status Solidi (RRL), 1, No. 4, pp. 162-164 (2007).
16. Phys. Stat. Sol. (a) 178, pp. 331 (2000).
17. "Light-Emitting Diodes" ($2^{nd}$ Edition), Cambridge, pp. 93
18. Appl. Phys. Lett., 79, pp. 711-714 (2001).
19. Appl. Phys. Lett., 84(6), pp. 855-858 (2004).
20. J. Crys. Grow., 298, pp. 703-705 (2007).
21. "Highly Selective PEC Etching of GaN Device Structures," pp. 80-90 (2004)

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light emitting device, comprising:
a III-nitride light emitting diode (LED) comprised of an active III-nitride layer that emits light formed between n-type and p-type III-nitride layers, wherein:
the III-nitride layers are semi-polar or non-polar III-nitride layers;
at least one surface of the LED is a textured surface;
the textured surface is comprised of at least one conical feature having at least one sloped sidewall that reflects or transmits at least one light ray incident thereon from inside the conical feature; and
the sidewall is inclined, such that each time the light ray is reflected, there is an increased chance of the light ray being transmitted through the sidewall.

2. The device of claim 1, wherein:
the textured surface forms an interface with an external medium;
the conical feature with the sloped sidewall transmits the light ray into the external medium at the interface and reflects the light ray at the interface; and
the reflected light ray, after undergoing subsequent reflections inside the conical feature, has an increased incidence angle at the interface and consequently an increased chance of being transmitted to the external medium.

3. The device of claim 2, wherein the external medium has a refractive index less than the III-nitride layers.

4. The device of claim 1, wherein:
the sidewall is inclined, such that each time the light ray is reflected, an angle of incidence of the light ray relative to a surface normal of the sidewall decreases;
when the angle of incidence of the light ray is smaller than a critical angle, the light ray's transmission through the sidewall is increased; and
when the angle of incidence of the light ray is at least equal to the critical angle, the light ray is reflected by the sidewall.

5. The device of claim 4, wherein the sidewall is inclined such that the light ray escapes the conical feature when the angle of incidence is near normal.

6. The device of claim 1, wherein the conical features tile up most of the textured surface.

7. The device of claim 1, wherein the LED includes a substrate, and the textured surface is a surface of the substrate opposite the LED's growth front.

8. The device of claim 1, wherein the light is extracted from both sides of the LED.

9. A method for fabricating a light emitting device, comprising:
creating a III-nitride light emitting diode (LED) comprised of a III-nitride active layer that emits light formed between n-type and p-type III-nitride layers, wherein:
the III-nitride layers are semi-polar or non-polar III-nitride layers;
at least one surface of the LED is a textured surface;
the textured surface is comprised of at least one conical feature having at least one sloped sidewall that reflects or transmits at least one light ray incident thereon from inside the conical feature; and
the sidewall is inclined, such that each time the light ray is reflected, there is an increased chance of the light ray being transmitted through the sidewall.

10. The method of claim 9, wherein:
the textured surface forms an interface with an external medium;
the conical feature with the sloped sidewall transmits the light ray into the external medium at the interface and reflects the light ray at the interface; and
the reflected light ray, after undergoing subsequent reflections inside the conical feature, has an increased incidence angle at the interface and consequently an increased chance of being transmitted to the external medium.

11. The method of claim 10, wherein the external medium has a refractive index less than the III-nitride layers.

12. The method of claim 9, wherein:
the sidewall is inclined, such that each time the light ray is reflected, an angle of incidence of the light ray relative to a surface normal of the sidewall decreases;
when the angle of incidence of the light ray is smaller than a critical angle, the light ray's transmission through the sidewall is increased; and
when the angle of incidence of the light ray is at least equal to the critical angle, the light ray is reflected by the sidewall.

13. The method of claim 12, wherein the sidewall is inclined such that the light ray escapes the conical feature when the angle of incidence is near normal.

14. The method of claim 9, wherein the conical features tile up most of the textured surface.

15. The method of claim 9, wherein the LED includes a substrate, and the textured surface is a surface of the substrate opposite the LED's growth front.

16. The method of claim 9, wherein the light is extracted from both sides of the LED.

17. The method of claim 9, wherein the textured surface is formed by photolithography or nano-imprinting followed by etching.

18. The method of claim 9, wherein the textured surface is formed using a plasma assisted chemical etching.

19. The method of claim 9, wherein the textured surface is formed using a photo-enhanced chemical (PEC) etching.

20. A method for emitting light, comprising:
emitting light from a III-nitride light emitting diode (LED) comprised of a III-nitride active layer formed between n-type and p-type III-nitride layers, wherein:
the III-nitride layers are semi-polar or non-polar III-nitride layers;
at least one surface of the LED is a textured surface;
the textured surface is comprised of at least one conical feature having at least one sloped sidewall that reflects or transmits at least one light ray incident thereon from inside the conical feature; and the sidewall is inclined, such that each time the light ray is reflected, there is an increased chance of the light ray being transmitted through the sidewall.

* * * * *